United States Patent [19]

D'Aoust et al.

[11] Patent Number: 5,194,291

[45] Date of Patent: Mar. 16, 1993

[54] CORONA DISCHARGE TREATMENT

[75] Inventors: James R. D'Aoust, San Diego; Tihiro Ohkawa, La Jolla, both of Calif.

[73] Assignee: General Atomics, San Diego, Calif.

[21] Appl. No.: 689,295

[22] Filed: Apr. 22, 1991

[51] Int. Cl.⁵ .......................................... C23C 16/48
[52] U.S. Cl. ..................... 148/276; 118/723; 422/186.05; 422/186.06; 174/77 R; 174/74 A; 427/569; 427/573
[58] Field of Search ................ 118/723; 427/39; 422/186.05, 186.06; 174/77 R, 74 A

[56] References Cited

U.S. PATENT DOCUMENTS

| | | | |
|---|---|---|---|
| 2,969,463 | 1/1961 | McDonald | 250/49.5 |
| 3,483,374 | 12/1969 | Erben | 250/49.5 |
| 3,566,108 | 2/1971 | Weigl et al. | 250/49.5 |
| 3,920,992 | 11/1975 | Van den Bogaert | 250/315 |
| 4,353,970 | 10/1982 | Dryczynski et al. | 430/31 |
| 4,555,171 | 11/1985 | Clouthier et al. | 355/3 |
| 4,879,100 | 11/1989 | Tsutsui et al. | 422/186.05 |
| 4,894,256 | 1/1990 | Gärtner et al. | 427/39 |
| 4,940,521 | 7/1990 | Dinter et al. | 204/164 |
| 4,940,894 | 7/1990 | Morters | 250/324 |

OTHER PUBLICATIONS

Wierzchrn, et al., "Formation and Properties of Titanium Carbide Layers Produced on Steels Under Glow Discharge Conditions", *Proceedings of Annual International Conference on Plasma Chemical Techniques*, 4th Aug., 1989.

Spalvins, Talivaldis, "Advances and Directions of Ion Nitriding/Carburizing", *NASA Technical Memorandum 102398*, 2nd International Ion Nitriding/Carburizing Conference, sep. 18-20, 1989, pp. 1-4.

Veprek, S., "Preparation of Inorganic Materials, Surface Treatment, and Etching in Low Pressure Plasmas: Present Status and Future Trends", *Plasma Chemistry and Plasma Processing*, vol. 9, No. 1, Jan. 1989 (Supplement), pp. 29S-53S.

Tsutsui, et al., "Plasma Surface Treatment of Polypropylene-Containing Plastics", *Journal of Coatings Technology*, vol. 61, No. 776, Sep. 1989, pp. 65-72.

*Primary Examiner*—Richard Bueker
*Attorney, Agent, or Firm*—Fitch, Even, Tabin & Flannery

[57] ABSTRACT

Corona discharge treatment apparatus for treating or coating a surface of a conductive substrate includes a high voltage radio frequency power supply and a cable having a number of flexible conductors and other components. The cable has a first end connected to the power supply and a second end wherein the other cable components have been removed and the conductors extend from the remainder of the cable. The free ends of the conductors at the second end are disposed in a general non-parallel arrangement and the free end of each conductor is held in a separate insulator which extends beyond the free end it holds. Each free end is movable independently of the other free ends. The conductive substrate is held beneath the cable second end so that the upper surface is engaged by the insulators. The conductive substrate is grounded, and relative movement is effected between the second cable end and the conductive substrate while a gas mixture is introduced into the area of engagement between the upper surface and insulators.

20 Claims, 2 Drawing Sheets

CORONA DISCHARGE TREATMENT

BACKGROUND OF THE INVENTION

The present invention relates to a method and apparatus for surface treatment and deposition of coatings on a conductive material. More particularly, the present invention relates to such methods and apparatus that use corona discharge for applying a diffuse coating to the surface, and still more particularly to a cable for use in such methods and apparatus.

It is desirable to apply coatings to a surface of a conductive material to cause the material to have improved characteristics. For example, it is known to apply a diffused titanium carbide layer to a surface of steel to provide surface hardening of the steel. One method of achieving such coating involves the use of a glow discharge as a processing plasma, with the discharge being established and sustained using radio frequency (rf) power. Ion nitriding of titanium diffusion layers using a plasma assisted treatment typically occurs when the specimen to be coated is located in a vacuum chamber. For further information regarding surface treatment using plasma resulting from a glow discharge, reference may be made to, e.g., Wierzchon et al., "Formation and Properties of Titanium Carbide Layers Produced on Steels Under Glow Discharge Conditions," *Institute of Materials Science and Engineering*, Warsaw Technical University, Poland (1989); Talivaldis Spalvins, "Advances and Directions of Ion Nitriding/Carburizing", NASA Technical Memorandum 102398, September 1989; S. Veprek, "Preparation of Inorganic Materials, Surface Treatment, and Etching in Low Pressure Plasmas: Present Status and Future Trends", *Plasma Chemistry and Plasma Processing*, Vol. 9, No. 1, 1989 (Supplement); and U.S Pat. No. 4,894,256 to Gartner et al.

Additional patents known to applicants that provide background information relative to surface treatment using plasma resulting from a corona or glow discharge are as indicated below.

U.S. Pat. No. 4,940,521 to Dinter et al. discloses apparatus for treating the surface of electrically conducting materials such as metal foil or plastic film containing conductive particles, by means of electrical corona discharge. The electrodes, which are covered by dielectric material, extend horizontally and are spaced from the surface to be treated. A housing encloses the electrodes and is connected to receive atomized liquid.

U.S. Pat. No. 4,940,894 to Morters is directed to an electrode for a corona discharge apparatus. The electrode includes a steel tube with a dielectric covering.

U.S. Pat. No. 4,879,100 to Tsutsui et al. and "Plasma Surface Treatment of Polypropylene-Containing Plastics", Koichi Tsutsui et al., *Journal of Coatings Technology*, Vol. 61, No. 776, September 1989, are directed to corona discharge treatment apparatus for treating the surface of, for example, a plastic automobile bumper. The apparatus shown in the patent includes an electrode wire fitting member with a large number of electrode wires dependent therefrom for contacting the upper surface of the object to be treated. In FIG. 1a, the equipment is shown including a base electrode, which may be grounded and which is shaped to conform to the inside surface of the object to be treated.

U.S. Pat. No. 2,969,463 to McDonald shows apparatus for treating the surfaces of a plastic sheet. One of the fixed electrode assemblies, as shown in FIG. 3, is disposed spaced from a conductive roller on which the plastic sheet moves, with the fixed electrode being embedded in a coating of glass. FIG. 4 shows an alternative embodiment of the electrode assembly including a metal tube electrode disposed in a glass sleeve and terminating somewhat short of the end of the glass sleeve facing the moving plastic sheet. The electrode assembly is spaced from the moving plastic sheet.

U.S. Pat. No. 4,555,171 to Clouthier et al. illustrates a corona charging electrode including a plurality of metallic filaments. These filaments could have a diameter of approximately 0.001 inch. The device is for use in copying or printing apparatus.

U.S. Pat. No. 4,353,970 to Dryczynski et al. discloses apparatus for charging a dielectric layer. As shown in FIG. 10, the dc voltage electrode could include a number of individual metal wires which are held spaced apart and insulated with respect to one another between a pair of glass plates with each of the electrodes extending toward the layer beyond the plates.

From the above, it is seen that the concept of using corona discharge for the purpose of treating the surface of conductive material is well known and practiced in the art. There remains, however, a need in the art for improved methods and techniques for efficiently applying corona discharge treatments to a wide variety of different shaped and contoured surfaces.

SUMMARY OF THE INVENTION

Among the various objects, features and advantages of the present invention may be noted the provision of improved corona discharge treatment apparatus. The apparatus can uniformly treat both planar and nonplanar electrically conductive surfaces with a high frequency corona discharge plasma. Furthermore, the apparatus can treat a conductive material which can be held so that it is either concave, convex, flat, or combinations thereof. The apparatus includes a large plurality of flexible electrodes and means to maintain the electrodes at a uniform distance from the surface to be treated. Advantageously, the conductive material can be treated in situ and without placing the material in a vacuum chamber. Further, the apparatus of the present invention is reliable in service, has long service life and is relatively simple and economical to manufacture.

Briefly summarized, the corona discharge treatment apparatus of the present invention includes a high voltage, radio frequency (rf) power supply. The apparatus further includes a cable including a number of flexible conductors and other components. The cable has a first end connected to the power supply, and a second end wherein the other components have been removed and the conductors extend or hang from the remainder of the cable, much as the bristles of a brush extend from a brush handle. The free distal ends of the conductors at the second end are flexible and are generally disposed in a transposed arrangement. Further, the distal end of each conductor is held in a separate insulator which extends beyond the distal end which it holds. Each distal end is movable independent of the other distal ends. Hence, as required, the distal ends can flex and conform to whatever surface shape is being treated, e.g., concave, convex, concave/convex, or rough surfaces. Means are also provided for holding a conductive substrate beneath the second end so that the upper surface of the substrate is engaged by the insulators. Furthermore, the conductive substrate is grounded, and means are provided for effecting relative movement between the second cable end and the conductive substrate. A method of practicing the invention is also disclosed.

BRIEF DESCRIPTION OF THE DRAWINGS

The above and other objects, features and advantages of the invention will be more apparent from the following more particular description thereof, presented in conjunction with the following drawings, wherein.

Corresponding reference characters indicate corresponding components throughout the several views of the drawings.

DESCRIPTION OF THE PREFERRED EMBODIMENTS

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
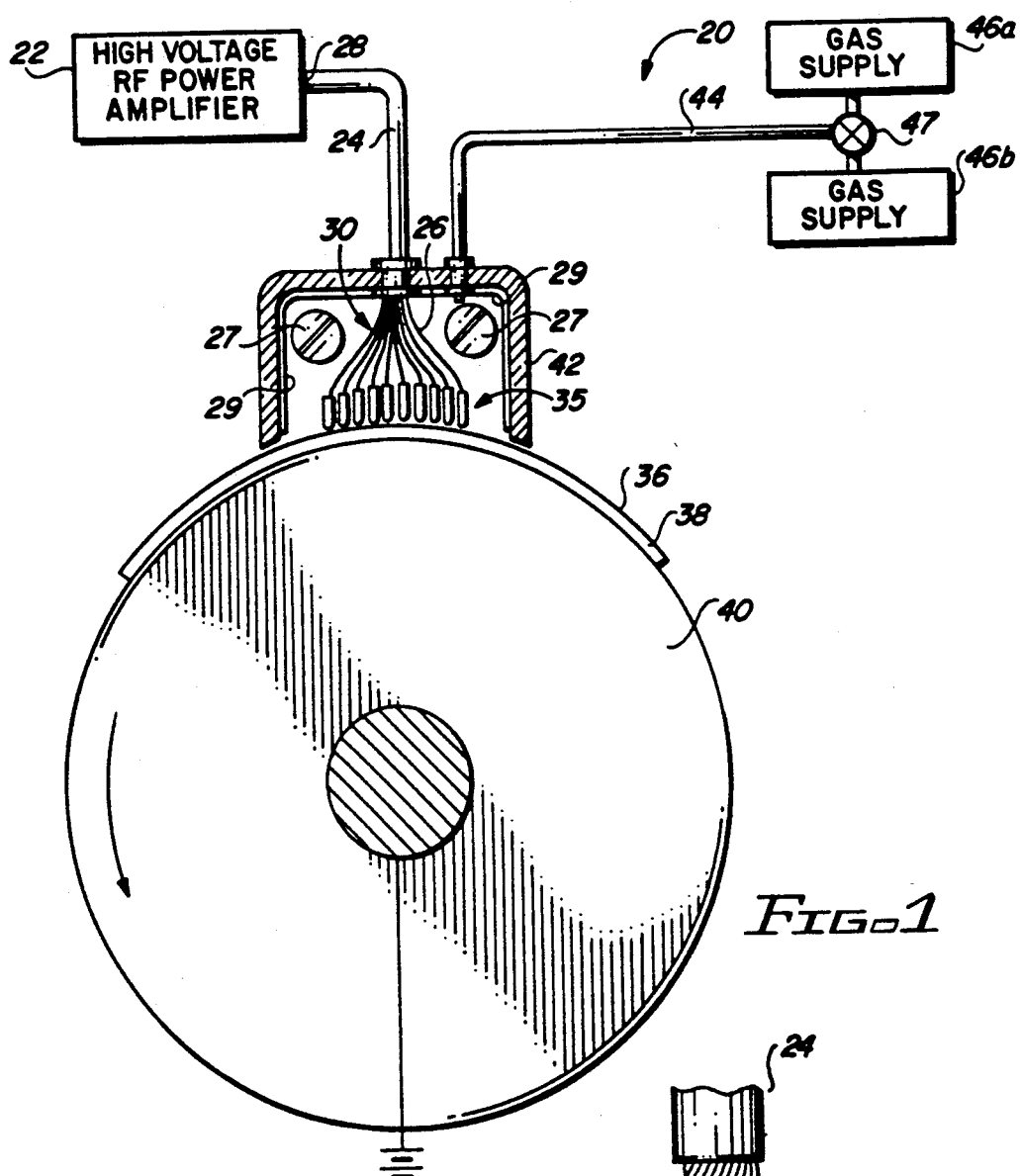
FIG. 1 is a simplified diagrammatic representation, partly in section, of corona discharge treatment apparatus of the present invention wherein the conductive material to be treated is supported on a roller underlying an electrode arrangement according to the present invention.

Referring now to the drawings, corona discharge treatment apparatus of the present invention for treating a surface of a conductive material is generally indicated by reference numeral 20 in FIG. 1. The apparatus 20 can be used, for example, to apply a diffuse layer of titanium carbide on a steel plate or strip. While the apparatus can be used in applying many other coatings or treatments on the surface or near the surface of various metals, as will be understood by those of skill in the art, the example of the titanium carbide diffusion layer on steel will be discussed below in highlighting the operation of the apparatus 20.

The corona discharge treatment apparatus 20 includes a high voltage, high rf power supply 22, best shown in FIG. 5 and discussed more fully below. Basically, a high frequency, e.g., 13 MHz, is required to help stabilize the atmospheric pressure "glow" plasma discharge. This is particularly important when a high percentage of hydrogen gas is used in the plasma discharge. An unstable plasma is not desired because it tends to transition into an arc-style discharge that produces a filamentary structure that is non uniform.

Figure 4:
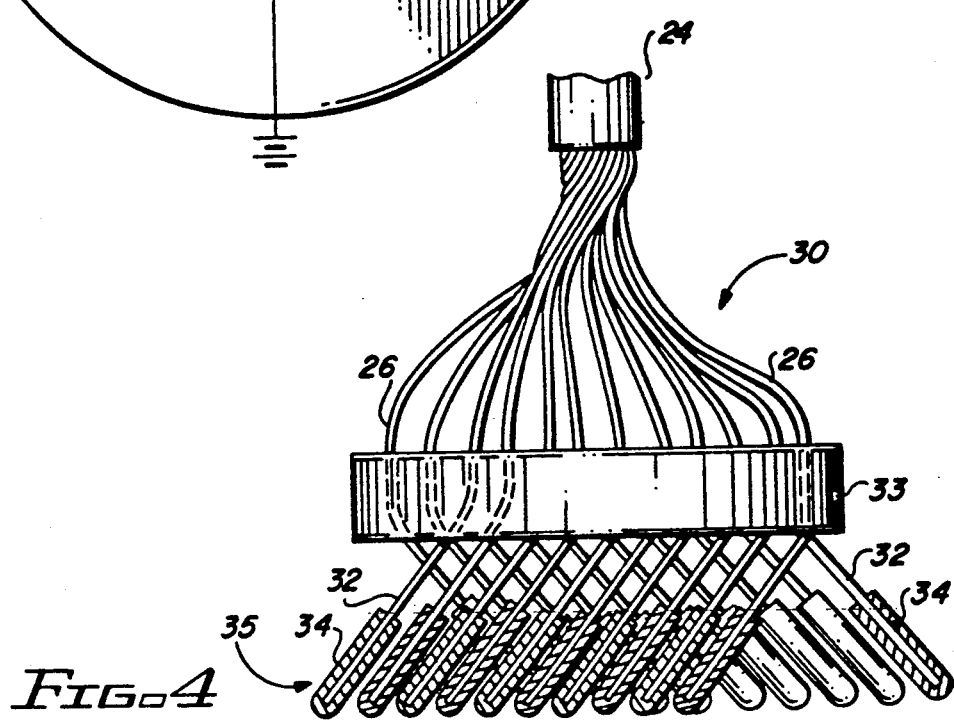
FIG. 4 is a greatly enlarged, simplified front elevational view, partly in section, of the electrode arrangement of the apparatus of FIG. 1, showing a preferred transposed arrangement of the many plasma electrodes up to the point where they contact the surface being treated.

A cable 24 is connected to the rf power supply 22. The cable 24 includes a large number, for example, one hundred, flexible conductors 26 along with other components such as an outer jacket and fillers. A first end 28 of the cable 24 is connected to the rf power supply 22. A second end 30 of the cable 24 has the other components of the cable (i.e., the outer jacket and fillers) removed. As best shown in FIG. 4, the conductors 26 at the second end preferably extend from the remainder of the cable in a non-parallel fashion.

Figure 2:
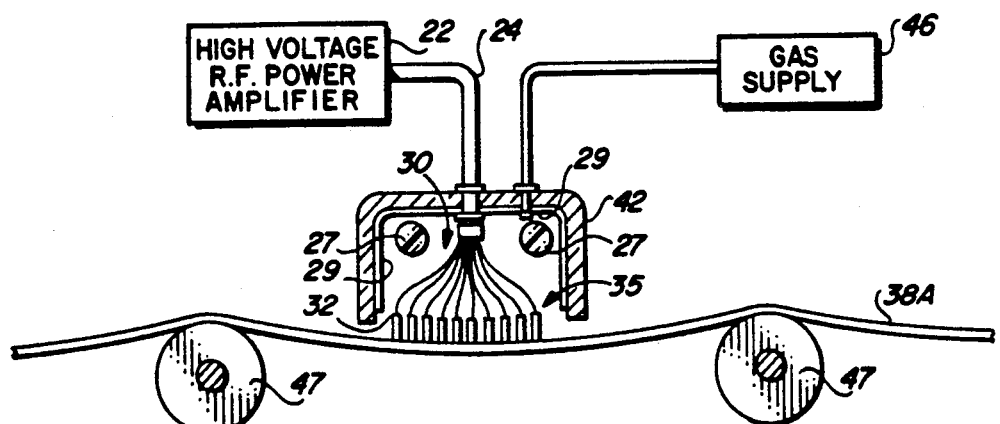
FIG. 2, similar to FIG. 1, shows the apparatus treating a strip of conductive material which is supported by spaced rollers.
Figure 3:
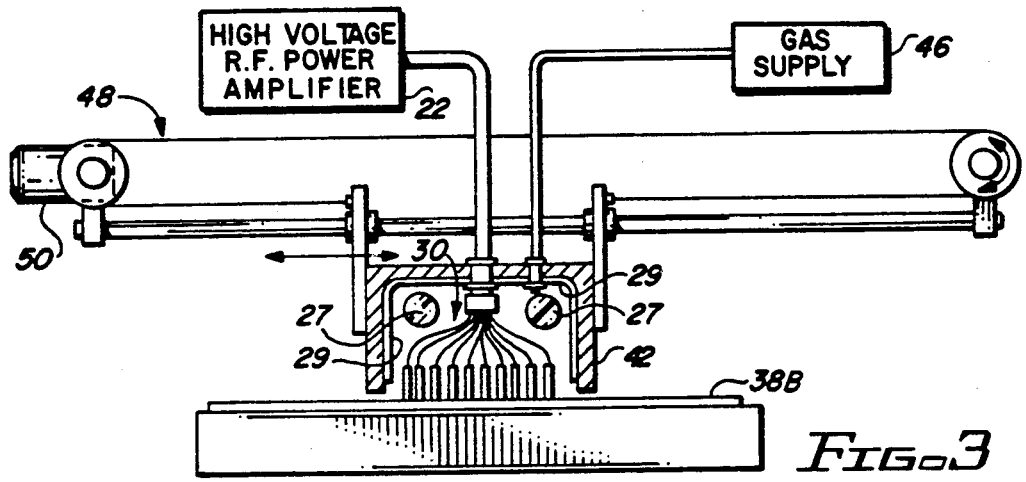
FIG. 3, also similar to FIG. 1, shows an alternative embodiment of the corona discharge treatment apparatus of the present invention wherein the material to be treated is held fixed and the electrode arrangement moves with respect to the surface to be treated.

Each conductor 26 has a free distal end 32. This free end 32 of each conductor 26 is held in a separate dielectric coating forming an insulator 34 which extends beyond the free end it holds. The conductors at the second cable end are splayed in two dimensions transverse to the longitudinal direction of the parallel ends to form an electrode brush 35 for contacting the upper surface 36 of the conductive material 38 to be treated. The dielectric coating may be chosen from a range of materials including alumina, silica, quartz or glass. The dielectric coating may be formed by selecting a length of a capillary tube and applying heat to one end causing melting and resultant closure of that end. The free ends of the conductors can be inserted into the thus-formed tubes and adhesive applied to hold the insulators in position. The resulting free ends 32, inserted into the dielectric tube insulators 34 may be considered as the "bristles" of the electrode brush 35. It is desired, as explained more fully below in connection with FIG. 4, that these "bristles" be maintained in a non-parallel relationship. It is noted that while the representation of the bristles in FIGS. 1, 2 and 3 shows the bristles as being parallel, this is done for simplicity of illustration, and is not necessarily representative of the preferred bristle arrangement.

The output voltage of the power supply 22 is preferably greater than 5 kV and is most preferably about 10 kV, while the output frequency of the power supply is preferably greater than 500 kHz and is most preferably about 13 MHz or higher. As indicated above, a high frequency is required to stabilize the atmospheric glow or corona plasma discharge. To achieve substantially equal rf current flow in each of the free ends of the conductors 26, i.e., to have equal currents flowing in each bristle of the electrode brush, the conductors 26 disposed between the first and second cable ends are twisted and interwoven so that each conductor takes up numerous possible positions in the cross section of the cable. Such a cable is known as a litz or Litzendraht cable. Advantageously, by operating at such a high frequency, the plasma discharge formed between the tips of the free ends 32 and the upper surface 36 becomes what is known as a dielectric barrier discharge, or "silent" discharge. Such a barrier or silent discharge produces a glow discharge at atmospheric pressures that is uniform. A uniform glow discharge, in turn, allows the apparatus 20 to render a more uniform coating or treatment on or near the surface of the material 38 being treated.

Referring to FIG. 1, the corona discharge treatment apparatus 20 is shown treating the upper surface of a steel strip which is supported beneath the electrode brush 35 by means of a driven roller 40, resulting in the surface to be treated being convex. As the conductor free ends 32, or "bristles" of the brush 35, are flexible, and as the insulators 34 each extend the same distance beyond the free end 32, there is a common conductor tip to surface spacing without regard to whether the surface to be treated is convex, concave or planar, or combinations of convex, concave, or planar. Thus, the electrode brush 35 is able to conform to all surface shapes. Furthermore the electrode brush 35 can treat a surface having either a smooth or a somewhat rough topology. The insulator 34 eliminates short circuiting or arcing between the discharge electrodes (the free ends 32) and the base electrode (the material 38 being treated) and the common spacing between discharge electrodes and the base electrode serves to maintain the electric fields in the corona plasma consistent or uniform as the material moves underneath the electrode brush 35. Preferably adjacent rows of the discharge electrode free ends 32 are oriented in a transposed fashion to prevent coupling of magnetic fields within the bristle array. This enables proper current sharing among all the bristle ends (electrode free ends 32) of the electrode brush 35.

The corona discharge treatment apparatus 20 also includes an insulating boot 42 overlying the portion of the surface to be treated and holding the electrode brush. The boot 42 may be mechanically supported and in turn can support the second cable end. A gas supply pipe 44 provides a mixture of gases from two or more gas supply tanks 46a and 46b, connected to the supply pipe 44 by way of a suitable control valve 47. (Hereafter, these gas supply tanks 46a and 46b and valve 47 may be collectively referred to and shown as the gas supply tank 46.) The particular gases utilized depend on the particular treatment being performed.

Typically, the gases used include a halide and a reducing gas, such as hydrogen. In the example discussed above in which a titanium carbide diffusion layer is to be achieved, the two gases would comprise titanium tetrachloride (TiCl$_4$) vapors and hydrogen (H). The hydrogen gas is necessary to reduce the TiCl$_4$ to lower titanium chlorides, e.g., TiCl$_3$ and TiCl$_2$, which supply the titanium to the steel surface under treatment. The steel surface to be treated should contain 0.5 or more weight percent carbon. The preferred mixture by weight of the gases would be about 0.05 parts titanium tetrachloride to 1 part hydrogen. The temperature at which this process should be carried out is about 900° C. See, e.g., Wierzochon et al., supra (Warsaw, Poland, 1989) for a more thorough description of the chemistry and required operating conditions for carrying out this treatment process Still referring to FIG. 1, at least one arc lamp 27 is included within the boot 42 in order to maintain the temperature at the treatment site at the desired level, e.g., 900° C. Two such arc lamps 27 are shown in FIG. 1. Also included within the boot 42 is a thermal reflector 29. The reflector 29 is positioned inside of the boot 42 so as to serve as a thermal radiation reflector/shield that focuses the radiant energy from the arc lamp(s) 27 onto the substrate being treated.

Referring to FIG. 2, as the free ends 32 hang pendent and are flexible, and as each has the insulator 34 holding the corresponding free end, the electrode brush can also treat the upper surface of a strip 38A when the strip is supported by spaced rollers 46. As shown in FIG. 3, the portion of the strip being treated forms a catenary, but this is not necessary for proper use of the invention. As indicated above, due to the flexibility of the "bristles" of the electrode brush 35, it may be used with any type of surface shape or topology.

FIG. 3 shows an alternative embodiment of the corona discharge treatment apparatus of the present invention where the strip to be treated is fixed and the electrode brush 35 is moved horizontally across or in the longitudinal direction of the strip. The apparatus includes a drive 48 including a motor 50 and a drive pulley guided by a roller arrangement for reciprocating the electrode brush 35.

FIG. 4 shows a greatly enlarged, simplified front elevational view, partly in section, of one possible electrode arrangement of the electrode brush 35. It is desired that the individual conductors 26 not be parallel to each other for any substantial length of the cable 24, including the tip of the cable 24. Hence, for the particular electrode arrangement shown FIG. 4, the individual conductors 26 are unwound from the Litzendraht cable 24 and directed through a non-conductive bristle plate 33. It is the function of the bristle plate 33 to space and orient the electrodes in a desired transverse electrode arrangement. The particular electrode arrangement shown in FIG. 4 includes a first row of "bristles" sloping in one direction, a second row of "bristles" sloping in another direction, and so on, with adjacent rows sloping in different directions, thereby forming the desired transverse electrode arrangement. With this arrangement, the coupling of magnetic fields from one conductor to another is minimized, thereby enabling proper current sharing among the brush electrodes.

It is to be emphasized that the transverse electrode arrangement shown in FIG. 4 is only representative of numerous different types of electrode arrangements that could be used. Any electrode arrangement that serves to maintain the "bristles" of the electrode brush in a non-parallel or transposed relationship, so as to reduce coupling of electromagnetic fields from one conductor to another, could be used.

Figure 5:
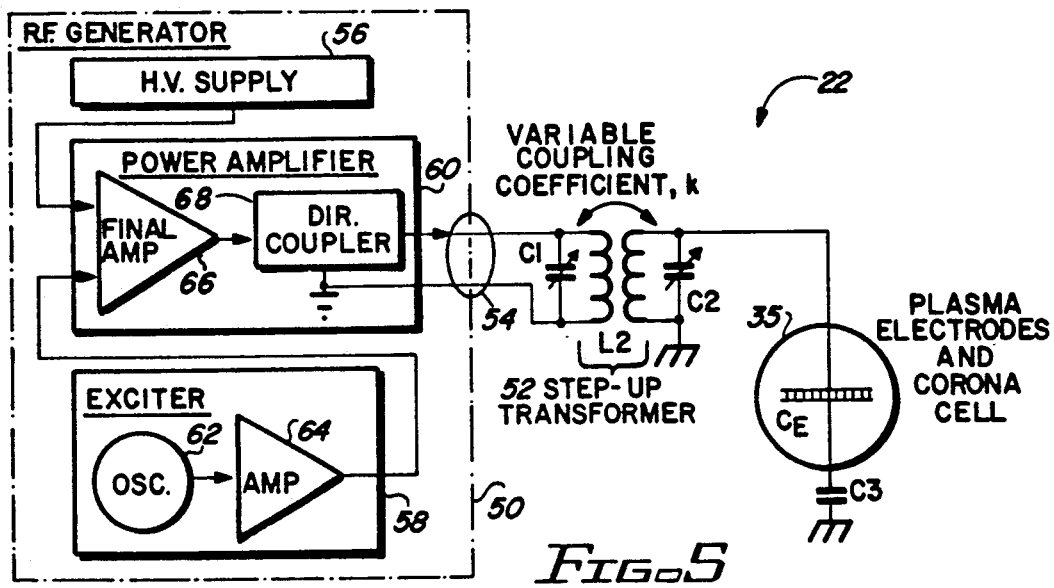
FIG. 5 is a block/schematic diagram of a high voltage radio frequency (rf) power amplifier of a type that may be used in the apparatus of the present invention.

Referring next to FIG. 5, a block schematic diagram of the high voltage rf amplifier 22 is shown. The rf amplifier includes an rf generator 50 and a step-up transformer 52. The rf generator 50 generates a 13.56 MHz signal that provides a power output of about 1250 watts into a 50 ohm load. The rf generator includes three main components: a high voltage power supply 56, an exciter circuit 58, and a power amplifier 60. The exciter circuit includes a 13.56 MHz oscillator 62, an amplifier 64, and a low voltage and bias power supply (not shown). The power amplifier 60 includes a final amplifier 66 and a directional coupler 68. The final amplifier 66 modulates the power output from the high voltage power supply 56 with the output from the exciter circuit 58, e.g., the 13.56 MHz signal. All of the components used in the rf generator 50 may be obtained commercially from, e.g., R.D. Mathis Co., as rf Generator Model SG-1250. Each of the three main components—the exciter circuit 58, the power supply 56, and the power amplifier 60—come as separate assemblies that may be conveniently mounted on a standard 19 inch relay rack panel, and housed in a cabinet that includes appropriate air cooling.

The 1250 watt output signal from the rf generator 50 corresponds to a maximum output voltage of about 250 volts (rms) into a 50 ohm load. This is not a high enough voltage for the corona discharge apparatus 20 of the present invention. Hence, a coupling transformer 52, and related circuitry, is used to step up the voltage to much higher value, e.g., 5–10 kilovolts.

This step-up circuit includes two main features: a high Q in the secondary of the coupling transformer 52, and a variable coupling coefficient, k, between the primary and the secondary of the coupling transformer.

As seen in FIG. 5, the electrode brush 35 appears electrically as a capacitor $C_E$, and this capacitor $C_E$ forms part of a resonant LC circuit, also known as a tank circuit, in the secondary of the coupling transformer 52. The value of the inductor L2 is fixed (at about 1.25 $\mu$H, and water cooled). A variable capacitor C2, in parallel with the plasma electrodes (capacitor $C_E$), is thus used to tune the circuit to the desired resonant frequency of 13.56 MHz. A fixed capacitor C3 (500 pF), in series with the plasma electrodes ($C_E$), is chosen to be much larger than the capacitance of the plasma electrodes, $C_E$, and provides a convenient means for monitoring the current flowing through the plasma electrodes. That is, the voltage across C3 is measured to determine the rf current through the electrodes.

In operation, the output voltage of the LC circuit, or tank circuit, is approximately equal to the voltage across the plasma electrodes. This voltage depends on both the rf power P circulating in the tank circuit, and on the Q of the circuit, in accordance with the relationship:

$$V^2 = 2\pi \cdot Q \cdot f_0 \cdot L2 \cdot P$$

where V is the output voltage and $f_0$ is 13.56 MHz. It is thus desirable to have Q and L2 be as high as possible. To accomplish this, a low-loss vacuum capacitor is used for C2 (to minimize losses), such as a Jennings UCSF-500 12-500 pF variable capacitor. The inductance L2 is a water-cooled coil made from ¼ inch copper tubing. It is wound on a 2.0 inch form so as to provide an inductance of approximately 1.25 $\mu$H. This particular size represents a compromise between having Q increase with the radius of the coil, and having Q decrease with the proximity of the coil to whatever shielding box walls may be used. The copper tubing is also preferably silver plated to increase Q. Preferably, Q should have a measured value of approximately 200.

As evident from the above equation, the output voltage of the tank circuit increases with increasing power P into the circuit. Power is transferred inductively from L1 and the primary circuit to L2 and the secondary circuit. The power transfer from the primary to the secondary depends on the value of the inductive coupling constant k between L1 and L2. The condition for maximum power transfer occurs at a critical value of k equal to 1/Q. In order that k can be varied to so as to reach this critical value, the inductor L1 is mounted on a sliding rod that can be moved physically closer to or farther from L2, thereby increasing or decreasing k. Because this tuning rod passes through the inductor L2, it is important that it be made of a material with low rf losses, such as alumina, so that it doesn't reduce the Q of the secondary circuit. L1 is wound to have an inductance of approximatley 2.5 $\mu$H. A variable capacitor C1 is connected in parallel with L1 to better tune the primary circuit to the desired operating frequency of 13.56 MHz. Like capacitor C2, the capacitor C1 is preferably realized using a low-loss vacuum capacitor, such as the Jennings UCS-300-7.5s 10-300 pF variable capacitor.

As a method of treating a large area of material, such as a strip or plate of steel, the present invention includes several steps:

a) A cable is provided having at one end thereof a plurality of flexible conductors depending from the remainder of the cable. The conductors have free ends with each free end held in an insulator extending beyond its free end away from the remainder of the cable. Each insulator extends substantially the same distance beyond the free end it holds. The other end of the cable is connected to a source of high voltage, radio frequency power.

b) The insulators are caused to engage the upper surface of the length of the material.

c) The length of the material is grounded so that a corona discharge will be formed between the conductor free ends and the upper surface of the material.

d) A gas is introduced into the area of the corona discharge, which gas includes a halide containing the element of which the diffusion layer is to be formed and a reducing gas, such as hydrogen.

e) Relative movement is effected between the free ends and the surface so that the insulators stay in substantially continuous engagement with the upper surface.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Corona discharge treatment apparatus for treating a surface of a conductive substrate, said apparatus comprising:

a high voltage, radio frequency power supply;

a cable including a plurality of flexible conductors and other components, said cable having a first end connected to said power supply, said cable having a second end wherein said other components of said cable have been removed with said conductors depending from the remainder of said cable, the free ends of said conductors at said second cable end being disposed in general non-parallel arrangement, and the free end of each conductor being held in a separate insulator which extends beyond the free end which it holds, each free end being movable independently of the other free ends;

means for holding the conductive substrate beneath said cable second end so that the upper surface of said substrate is engaged by said insulators;

means for connecting said conductive substrate to ground; and means for effecting relative movement between said cable second end and said conductive substrate.

2. Corona discharge treatment apparatus as set forth in claim 1 wherein said conductors disposed between said first and second cable ends are relatively so disposed that each conductor takes up numerous possible positions in the cross section of said cable so as to prevent coupling of electromagnetic fields between said conductors, thereby offering lower resistance to high frequency current and assuring more equal current sharing among said conductors.

3. Corona discharge treatment apparatus as set forth in claim 1 further comprising an enclosure of insulating material enclosing said cable second end and overlying the portion of the conductive substrate to be treated, said apparatus further including a gas inlet extending inside said enclosure.

4. Corona discharge treatment apparatus as set forth in claim 3 further including means for supplying a gas mixture to said gas inlet.

5. Corona discharge treatment apparatus as set forth in claim 4 wherein said gas mixture includes titanium tetrachloride.

6. Corona discharge treatment apparatus as set forth in claim 3 further including means for elevating the temperature within said enclosure of insulating material.

7. Corona discharge treatment apparatus as set forth in claim 6 wherein said means for elevating the temperature within said enclosure of insulating material comprises at least one arc lamp.

8. Corona discharge treatment apparatus as set forth in claim 7 further including a thermal radiation reflector/shield inside of said enclosure of insulating material for directing radiant energy emitted from said at least one arc lamp to the conductive substrate to be treated.

9. Corona discharge treatment apparatus as set forth in claim 1 wherein the free ends of said conductors at said second cable end are disposed in a transposed arrangement comprising a first row of conductor free ends slanting in one direction, a second row of conductor free ends slanting in another direction, and so on, with adjacent rows of said conductor free ends slanting in different directions.

10. Corona discharge treatment apparatus as set forth in claim 1 wherein each insulator comprises a sleeve sized to receive one of said conductors and having a closed end.

11. Corona discharge treatment apparatus as set forth in claim 10 wherein said insulators are formed of alumina.

12. Corona discharge treatment apparatus as set forth in claim 10 wherein said insulators are formed of silica.

13. Corona discharge treatment apparatus as set forth in claim 10 wherein the closed ends of said sleeves have a common length so that with the conductors inserted into the sleeves and the sleeves contacting the conductive substrate, the free ends of the conductors are uniformly spaced from the upper surface of the conductive substrate.

14. Corona discharge treatment apparatus as set forth in claim 1 wherein the output frequency of said power supply is greater than 500 kHz, whereby a corona plasma is achieved without the formation of an arc-style discharge.

15. Corona discharge treatment apparatus as set forth in claim 14 wherein the output frequency of said power supply is at least about 13 MHz.

16. Corona discharge treatment apparatus as set forth in claim 1 wherein the output voltage of said power supply is about 5 kV.

17. A cable for use in corona discharge treatment apparatus, said cable comprising:
  a plurality of discrete flexible electrical conductors and other components;
  said cable having a first end for connection to a source of high voltage, radio frequency power;
  said cable having a second end wherein said other components have been removed and said conductors depend from the remainder of said cable, said conductors having free ends at said second end with said free ends being disposed in a transposed arrangement, each of said free ends being held in an insulator which extends beyond the free end it holds, all of said insulators extending substantially the same distance from the corresponding free ends, whereby with said dielectrics engaging the upper surface of a conductive substrate to be treated, said free ends of the conductors are spaced substantially uniformly from said upper surface.

18. A method of treating the upper surface of a length of conductive material, such as a strip or plate of steel, to improve characteristics of said material by causing the formation of a diffusion layer of an element at or adjacent said upper surface, said method comprising the following steps:
  providing a cable having at one end thereof a plurality of flexible conductors depending from the remainder of said cable, said conductors having free ends with each free end held in an insulator which extends beyond its free end away from the remainder of said cable, each said insulator extending substantially the same distance beyond the free end it holds;
  connecting the other end of said cable to a source of high voltage, radio frequency power;
  causing the insulators to engage said upper surface of said length of material;
  grounding said length of material so that a corona discharge will be formed between said conductor free ends and said upper surface;
  introducing into the area of said corona discharge a gas mixture comprising a halide gas containing the element of which said diffusion layer is to be formed and a reducing gas, such as hydrogen; and
  effecting relative movement between the insulators and said upper surface so that said insulators are maintained in substantially continuous engagement with said upper surface.

19. The method as set forth in claim 18 further including elevating the temperature of the length of material in the area of said corona discharge to a prescribed temperature.

20. The method as set forth in claim 19 wherein the conductive material comprises steel containing 0.5 or more weight percent carbon, the diffusion layer comprises titanium carbide, the gas mixture includes titanium tetrachloride and hydrogen, and the prescribed temperature comprises about 900° C.

* * * * *